United States Patent
Khor et al.

(10) Patent No.: US 10,170,439 B1
(45) Date of Patent: Jan. 1, 2019

(54) CHAMFERING FOR STRESS REDUCTION ON PASSIVATION LAYER

(71) Applicant: GLOBALFOUNDRIES INC., Grand Cayman (KY)

(72) Inventors: Ee Jan Khor, Singapore (SG); Juan Boon Tan, Singapore (SG); Wanbing Yi, Singapore (SG); Ramasamy Chockalingam, Singapore (SG); Qian Chen, Singapore (SG); Suleni Tunggal Mulia, Singapore (SG); Yongmei Hu, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/719,861

(22) Filed: Sep. 29, 2017

(51) Int. Cl.
| | |
|---|---|
| *H01L 23/52* | (2006.01) |
| *H01L 23/00* | (2006.01) |
| *H01L 23/482* | (2006.01) |
| *H01L 23/31* | (2006.01) |
| *H01L 23/522* | (2006.01) |

(52) U.S. Cl.
CPC .......... *H01L 24/05* (2013.01); *H01L 23/3171* (2013.01); *H01L 23/4824* (2013.01); *H01L 23/5226* (2013.01); *H01L 24/03* (2013.01); *H01L 24/13* (2013.01); *H01L 2224/0391* (2013.01); *H01L 2224/05012* (2013.01); *H01L 2224/05073* (2013.01); *H01L 2224/13007* (2013.01)

(58) Field of Classification Search
CPC . H01L 24/05; H01L 23/3171; H01L 23/4824; H01L 23/5226; H01L 24/03; H01L 24/13
USPC .......................................................... 257/786
See application file for complete search history.

(56) References Cited

U.S. PATENT DOCUMENTS

| | | | |
|---|---|---|---|
| 6,181,016 B1 * | 1/2001 | Lin | H01L 24/05 257/758 |
| 6,313,540 B1 * | 11/2001 | Kida | H01L 24/03 257/784 |
| 7,768,130 B2 | 8/2010 | Hsu et al. | |
| 7,812,438 B2 | 10/2010 | Jadhav et al. | |
| 8,013,333 B2 | 9/2011 | Chen et al. | |
| 8,097,964 B2 | 1/2012 | West et al. | |
| 8,125,054 B2 | 2/2012 | West et al. | |
| 8,441,131 B2 | 5/2013 | Ryan | |
| 8,508,043 B2 | 8/2013 | Daubenspeck et al. | |

(Continued)

*Primary Examiner* — Luan C Thai
(74) *Attorney, Agent, or Firm* — Gibb & Riley, LLC; Anthony J. Canale

(57) ABSTRACT

Devices are formed to have inner layers that have electronic devices, and an outer passivation layer. A patterned conductor is formed on a first surface of the inner layers, and through conductors (that extend through interior insulator layers) are positioned to electrically connect the patterned conductor to the electronic devices. The patterned conductor includes a pattern of connected linear sections that are parallel to the first surface of the inner layers. The linear sections of the patterned conductor meet at conductor corners, and at least one of the conductor corners of the patterned conductor includes a chamfer side that terminates at the linear sections. Further, the chamfer side is not perfectly diagonal, but instead forms unequal angles with the linear sections that intersect to form the corner.

18 Claims, 9 Drawing Sheets

(56) References Cited

U.S. PATENT DOCUMENTS

| | | |
|---|---|---|
| 8,722,534 B2 | 5/2014 | Zhang et al. |
| 9,305,886 B2 | 4/2016 | Shao et al. |
| 9,496,232 B2 * | 11/2016 | Yajima ................... H01L 24/03 |
| 2012/0319237 A1 | 12/2012 | Cooney, III et al. |
| 2017/0236792 A1 | 8/2017 | Lee et al. |

\* cited by examiner

CHAMFERING FOR STRESS REDUCTION ON PASSIVATION LAYER

BACKGROUND

Field of the Invention

The present disclosure relates to integrated circuit structures, and more specifically, to components that reduce cracking and delamination of integrated circuit chips, especially at passivation layers.

Description of Related Art

Integrated circuit chip structures generally include internal devices, such as transistors, diodes, capacitors, etc. (which are sometimes referred to as front-end-of-line (FEOL) structures). Such internal devices are positioned on many internal layers, are separated by insulator materials, and are electrically connected to devices external to the chip using external connections (such as solder bumps or conductive columns) and such external connections are sometimes referred to as back-end-of-line (BEOL) structures. These external connection structures often have exposed conductive pads within the outermost insulator layer (which is sometimes referred to as a passivation layer).

However, such external connection structures can suffer from cracking and delamination. More specifically, BEOL structures often have to deal with harsh external environments, and must use different materials relative to internal layers of the integrated circuit (IC) unit (which is often a piece (or chip) diced from a larger wafer, and is often referred to as a "die" or "chip" off the wafer). These different materials in BEOL structures can have different coefficients of thermal expansion (CTE) relative to other layers internal to the IC chips. CTE mismatch is amplified at different material interfaces, such as interfaces between underfill and passivation, or underfill and substrate solder items. This problem can increase if the underfill has defects.

For example, a delamination starting at a die edge, may begin as an interfacial microcrack. In addition, microcracks (formed possibly during dicing), voids left by the material formation processes, surface contamination, etc., can contribute to microcracks and delamination. As some initial underfill flaws are unavoidable, preventing flaw propagation is highly useful.

SUMMARY

Exemplary devices herein include (among other components) one or more inner layers that have electronic devices, and an outer insulator layer (passivation layer) on the inner layers. The topmost inner layer has a first surface where the passivation layer contacts the inner layer. Also, there are patterned conductors (that form contact pads) on the first surface of the topmost inner layer. The patterned conductors are positioned to be capable of being contacted by a component external to the device, such as a wire or probe.

Additionally, through conductors (conductive vias that extend into the inner layers) are positioned to electrically connect the patterned conductors to the electronic devices, and this allows the external components to be electrically connected to the electronic devices within the inner layers. In one example, the through conductor is a bar via having a similar pattern to the pattern of connected linear sections of the patterned conductor, but with a reduced size relative to the patterned conductor's pattern; and the through conductor can also include chamfer sides (for example, at some of the locations where the patterned conductor includes chamfer sides).

Each of the patterned conductors includes a pattern (e.g., U-shaped, L-shaped, Z-shaped, T-shaped, V-shaped, etc., pattern) of connected linear sections that are parallel to the first surface of the topmost inner layer. The linear sections of the patterned conductors meet at conductor corners, and at least one of the conductor corners of each of the patterned conductors includes a chamfer side that terminates at the two linear sections that form the corresponding corner of the patterned conductor. Each chamfer side eliminates the right-angled corners between the linear sections that would otherwise occur. Further, the chamfer side(s) of each corner are not necessarily diagonal, but instead can form unequal angles (an angle of other than 45° with the linear sections that intersect to form the corner (thus, the chamfer side terminates at unequal lengths of corresponding linear sections from where an apex of a corresponding conductor corner would otherwise be).

More specifically, the right-angle conductor corners include inside corners, and outside corners opposite the inside corners. The conductor corners can have the chamfer sides at both the inside corners and the outside corners, only at the inside corners, or only at the outside corners.

Additionally, through conductors (e.g., vias and bar vias) extend through the passivation layer and are positioned to electrically connect the patterned conductors to the electronic devices, and this allows the external components to be electrically connected to the electronic devices within the inner layers. In one example, the through conductor is a bar via having a similar pattern to the pattern of connected linear sections of the patterned conductor, but with a reduced size relative to the patterned conductor's pattern; and the through conductor also includes chamfer sides (for example, at some or all of the locations where the patterned conductor includes chamfer sides).

Various methods herein form electronic devices in at least one inner layer, and form an outer insulator layer (passivation layer) on the outermost inner layer. The inner layer is formed to have a first surface where the passivation layer contacts the inner layer. Also, these methods pattern conductors on the first surface of the inner layer, where each of the patterned conductors is patterned to include a pattern of connected linear sections parallel to the first surface of the inner layer.

The linear sections are patterned to meet at conductor corners. More specifically, the conductor corners are patterned to include inside corners and outside corners opposite the inside corners. During this patterning, at least one of the conductor corners of each of the patterned conductors is patterned to include a chamfer side that terminates at the linear sections. Therefore, the patterning of the chamfer side eliminates right-angled corners between the linear sections.

In this processing, the chamfer side can be patterned to form unequal angles (an angle of other than 45°) with the linear sections, along the first surface. Thus, the chamfer side can be patterned to terminate at unequal lengths of corresponding linear sections from an apex of a corresponding conductor corner. Also, the conductor corners can be patterned to have the chamfer sides at both the inside corners and the outside corners, only at the inside corners, or only at the outside corners.

Additionally, these methods form through conductors (e.g., vias and bar vias) to extend through the passivation layer and be positioned to electrically connect the patterned conductors to the electronic devices, and this allows the external components to be electrically connected to the electronic devices within the inner layers. In one example, the through conductor is formed as a bar via having a similar pattern to the pattern of connected linear sections of the patterned conductor, but with a reduced size relative to the patterned conductor's pattern; and the through conductor also includes chamfer sides (for example, at some or all of the locations where the patterned conductor includes chamfer sides).

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, BEOL structures often have to deal with harsh external environments, and must use different materials relative to adjacent layers. These different materials can have different CTEs, which can cause delamination and cracking. In view of this, devices and methods herein chop some or all of the corners where conductors (e.g., aluminum wires, etc.) are bent, and with this, the passivation dielectric covering the conductors have reduced stress, and cracking is prevented. With these structures, the chip package interaction reliability margin is improved by reducing cracking defects.

Figure 1:
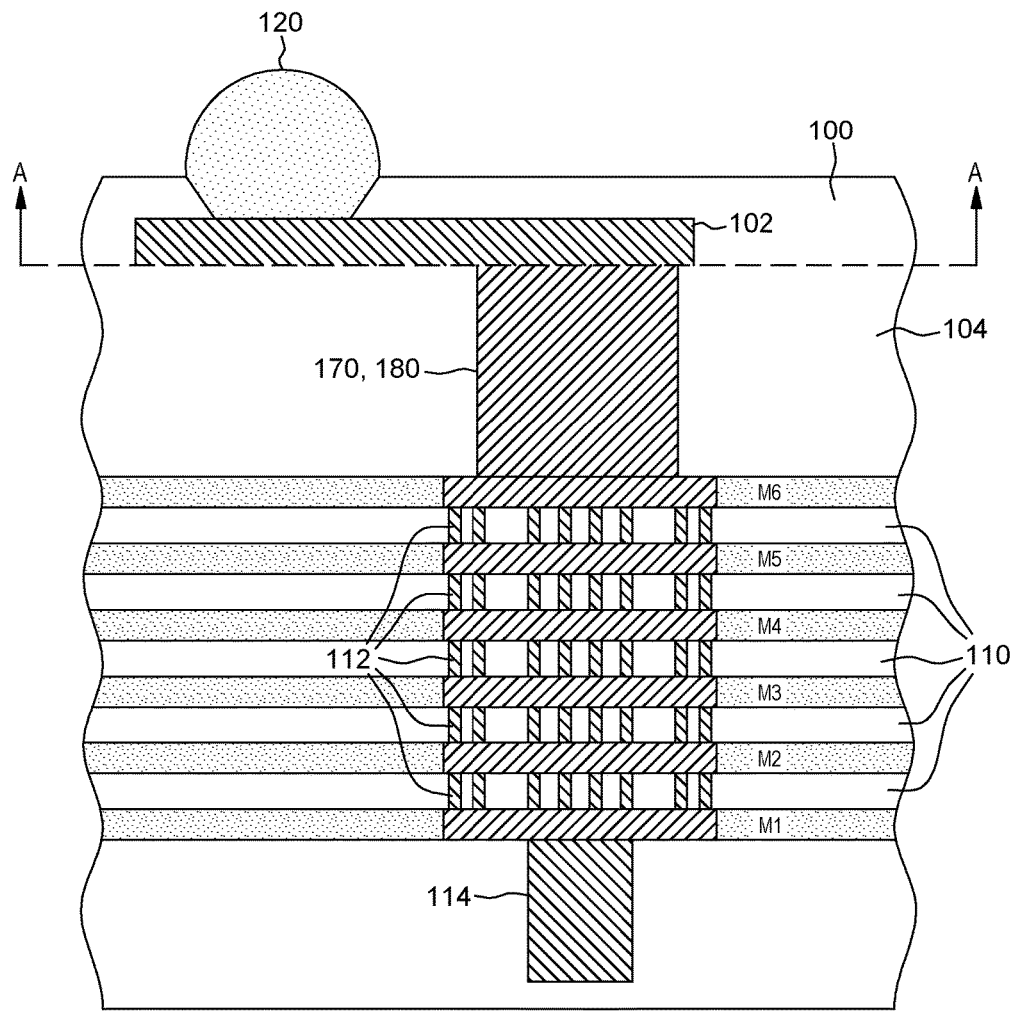
FIG. 1 is a cross-sectional schematic diagram illustrating a laminated integrated circuit device according to embodiments herein.

FIG. 1 is a cross-sectional schematic diagram illustrating a laminated integrated circuit device according to embodiments herein. More specifically, FIG. 1 illustrates various insulator/passivation layers (all of which are generally identified using identification numeral 100, 104, and 110). One or more conductive elements (e.g., a power via 114) is electrically connected to various metallization layers M1-MX (X may the number of metal layers used in the chip) through conductive vias 112 extending through intervening inter-layer dielectrics (ILD) layers 110. Also, additional conductive vias 170, 180 within an insulator 104 connect metallization layers M1-MX to a solder bump 120 through a conductive element 102 (that may form a patterned conductor that connects to the solder bump 120).

Therefore, FIG. 1 shows one or more inner layers 110 that have electronic devices (e.g., M1-MX) and an outer passivation layer 100 on the inner layers 104, 110. The inner layer 104 has a first surface where the passivation layer 100 contacts the outermost inner layer 104. Also, one or more patterned conductors 102 contact, or are adjacent to, the first surface of the inner layer 104. The patterned conductor 102 is positioned to be capable of being contacted by a component external to the device, such as a wire or probe. Additionally, through conductors 170, 180 (that extend into at least one of the inner layers 104) are positioned to electrically connect the patterned conductors 102 to the electronic devices in M1-MX, and this allows external components to be electrically connected to the electronic devices within the inner layers M1-MX.

However, the passivation layer 100 and/or patterned conductor 102 may be made of materials (e.g., aluminum, copper, gold, etc., or ceramics, poly-imide, polymers, plastics, rubbers, etc.) dictated by the harsh environments in which the chip may be expected to be used. Because these materials may be very different from the materials used internally within the chip (e.g., tungsten, hafnium, tantalum, molybdenum, titanium, nickel, metal silicide, polysilicon, etc., oxides, nitrides, etc.) there can be dramatic differences in coefficients of thermal expansion between such different materials, which can risk cracking, delamination, etc. In view of this, the devices herein use chamfer corner sides.

FIGS. 2A-4E are top-view (plan) schematic diagrams illustrating one layer of the laminated integrated circuit device shown in FIG. 1 along line A-A. One example of the conductor 102 shown in FIG. 1, is illustrated in FIGS. 2A-4D as a conductive wire 102, which is shown to have a U-shape (although, those ordinarily skilled in the art would understand that conductive wire 102 could have any shape that includes at least one sharp corner, such as L-shaped, Z-shaped, T-shaped, V-shaped, etc.).

Figure 2A:
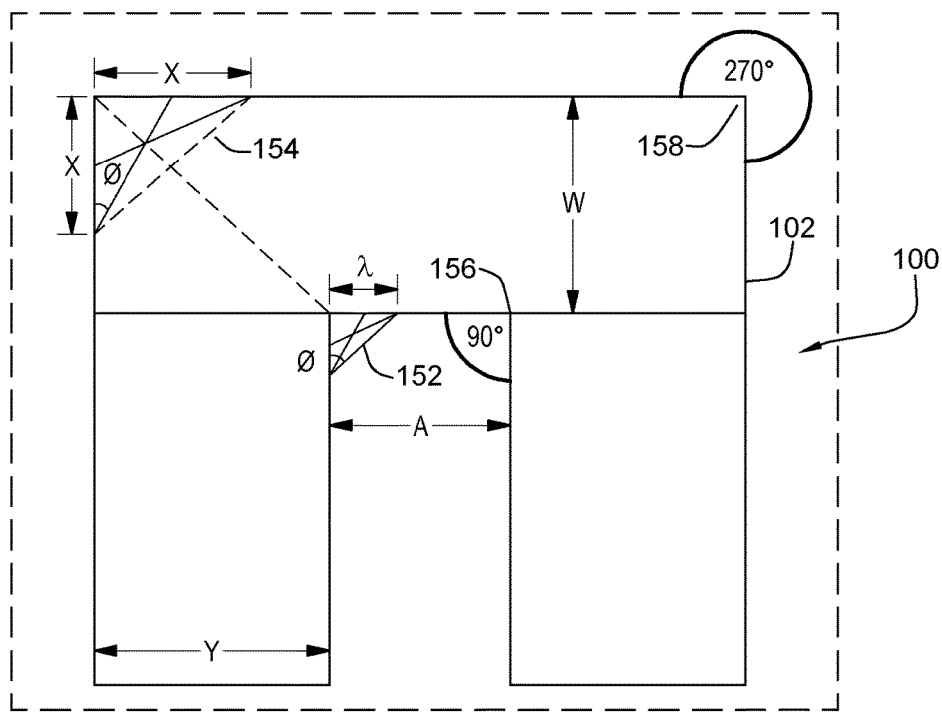
FIGS. 2A-4E are top-view (plan) schematic diagrams illustrating a laminated integrated circuit device according to embodiments herein.
Figure 2B:
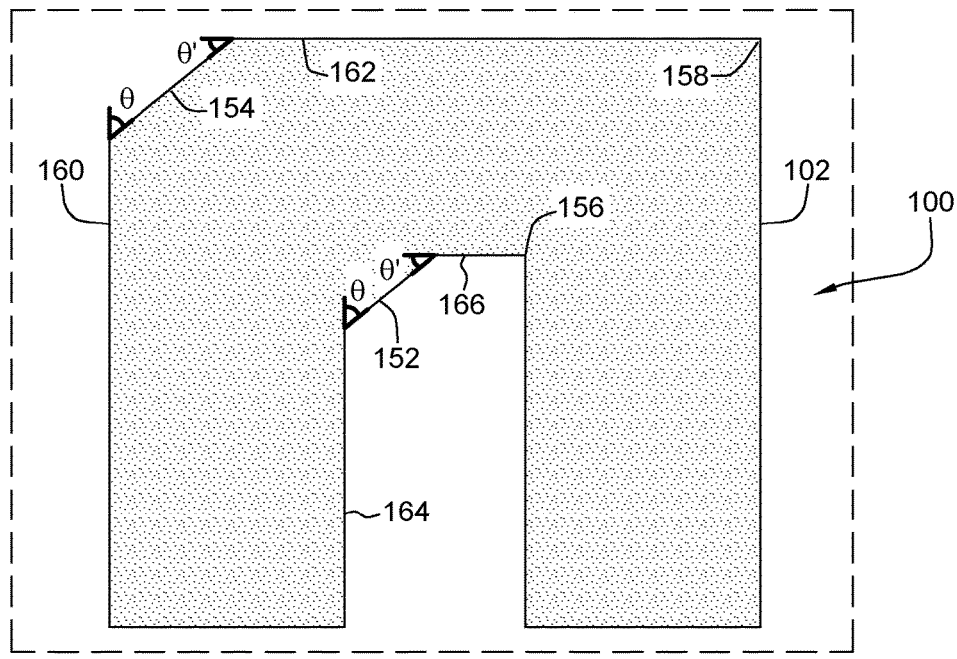

Note that FIGS. 2A and 2B show the same structure; however, in FIG. 2B many of the explanatory lines and angles shown in FIG. 2A have been removed to allow the continuous, unbroken conductor 102 to be illustrated more clearly. Similarly, FIGS. 3A and 3B; and 4A and 4B show the same structure with, and without, explanatory lines and angles. Also, to help the embodiments herein be more easily understood, different length/distance measures (e.g., D1-D4, etc.) and angles (e.g., θ, θ', etc.) are illustrated in some drawings, but are omitted from other drawings to avoid clutter; however, the other drawings, that reuse the previously used identification numbers, have the same angles and measures, even though such is not explicitly shown in the other drawings.

Thus, in this example, the patterned conductor 102 includes a pattern of connected linear sections (three linear sections (one of which is perpendicular to the other two), in this example) that are on, and parallel to (or within the plane of) the first surface of the inner layer 104. The linear sections of the patterned conductor 102 meet at conductor corners 156, 158, which are right-angle corners, in this example; however, the corners could have other shapes, such as where an angle of an arc that crosses the passivation layer 100 between sides of the linear sections forming the outside corners is between 90°-359° (which are considered "sharp" corners in this disclosure), etc. These sharp corners tend to concentrate CTE stress, and other stresses, at a single point, which increases the likelihood of forming cracks; while less sharp diagonal corners (e.g., 1°-89°) present less of a dramatic point at which stress forces can accumulate, which reduces the likelihood of forming cracks. At least one of the conductor corners 156, 158 of the patterned conductor 102 includes a chamfer side 152, 154 that terminates at the linear sections (160-166) that form the corner. In other words, a chamfer side is a relatively non-perpendicular linear side that connects two relatively perpendicular linear sides of the connected linear sections. Thus, the chamfer side(s) 152, 154 eliminate sharp corners, such as right-angled corners, between the linear sections (160-166).

In the example shown in FIG. 2A, if X is fixed; the angle θ is between 1° and 45° (1°≤θ≤45°); λ=β*A; and assume that Y<W. Then, the derivation of X=0.586*Y is as set forth below:

$$\left.\begin{array}{l}Y^2+Y^2=Z^2 \rightarrow Z=\sqrt{2}\,Y\\X^2+X^2=[(Z-Y)*2]^2\end{array}\right\} \quad 2X^2=\left[(\sqrt{2}\,Y-Y)*2\right]^2$$

$$\downarrow$$

$$\sqrt{2}\,X=(\sqrt{2}\,Y-Y)*2$$

$$\downarrow$$

$$X=(2-\sqrt{2}\,)Y=(2-1.414)Y=0.586Y$$

Figure 3A:
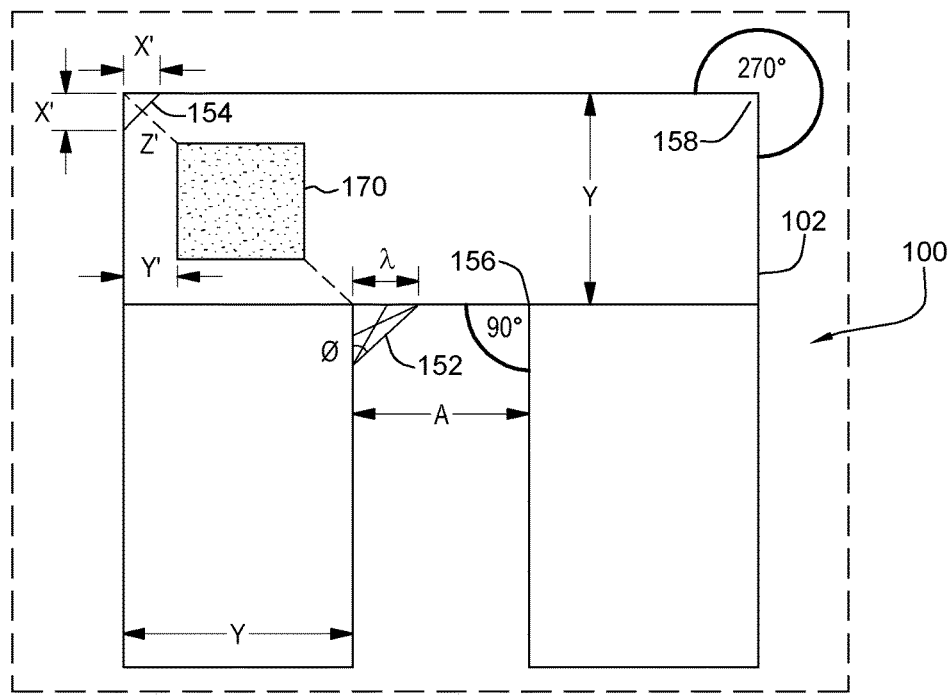
Figure 4A:
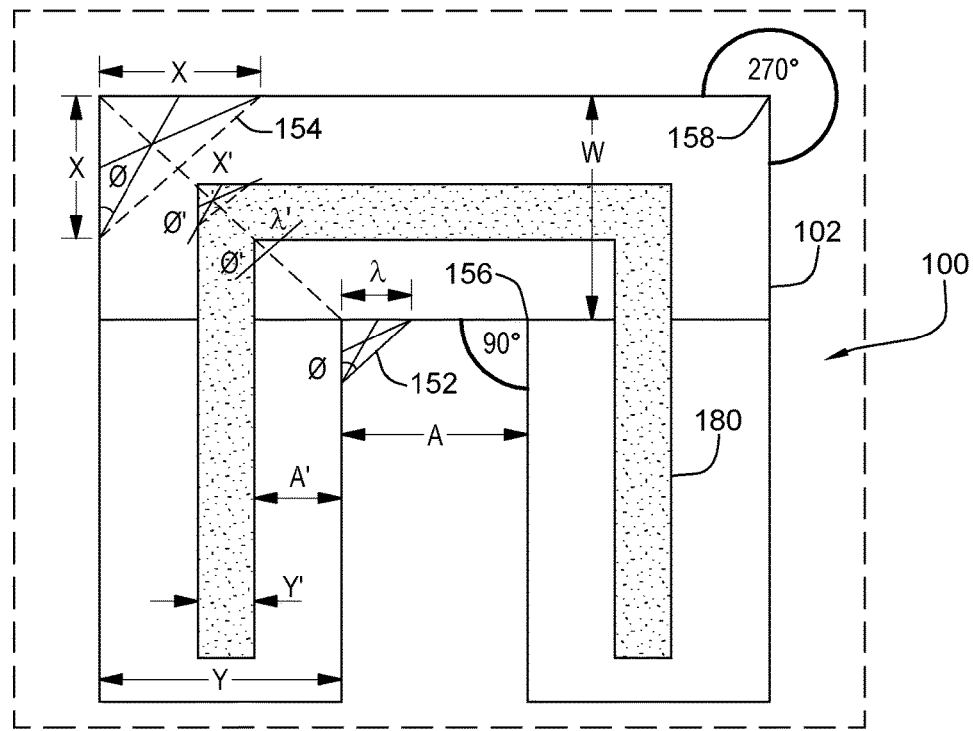

More specifically, the conductor corners 156, 158 include inside (right-angle, in this example) corners 156 and outside (right-angle, in this example) corners 158 opposite the inside corners 156. As shown in FIGS. 2A, 3A, and 4A, an angle of an arc that crosses the passivation layer 100 between sides of the linear sections forming the inside corners 156 (e.g., which is less than 180°, and is shown as 90° in this example) is less than an angle of an arc that crosses the passivation layer 100 between sides of the linear sections forming the outside corners 158 (e.g., which is greater than 180°, and is shown as 270° in this example).

Figure 2C:
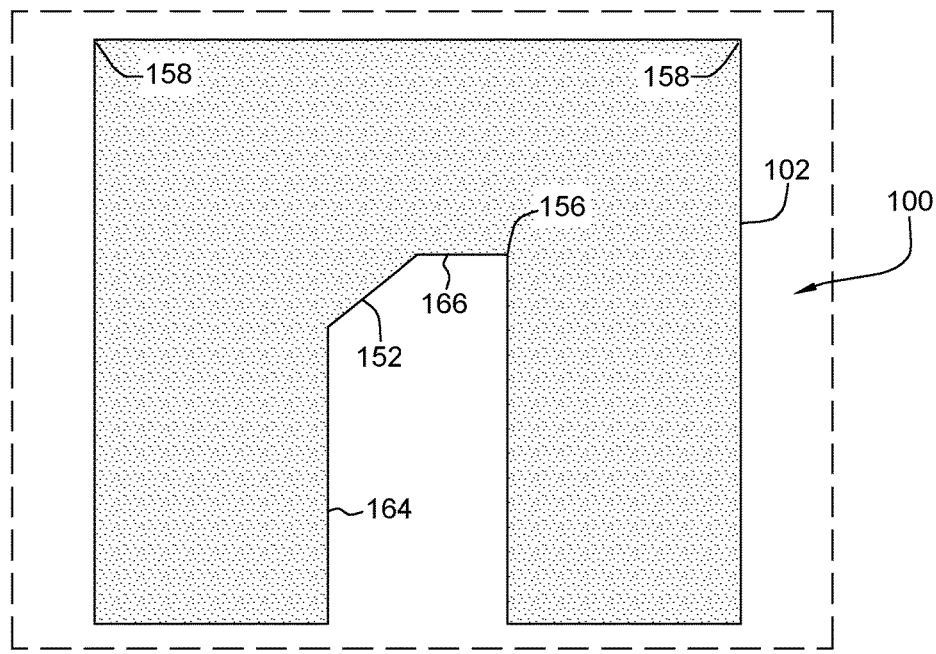
Figure 2D:
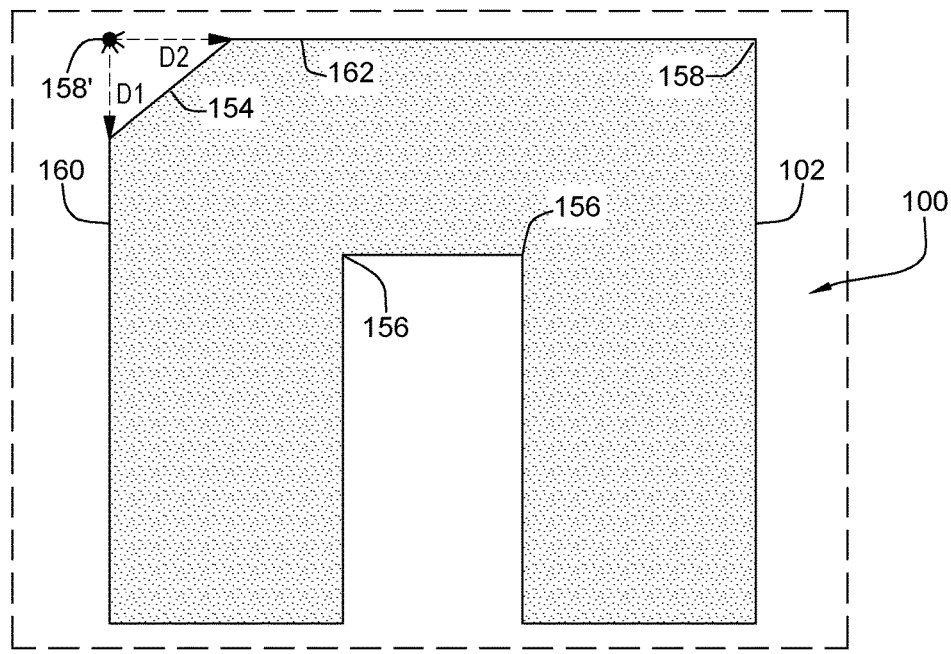
Figure 2E:
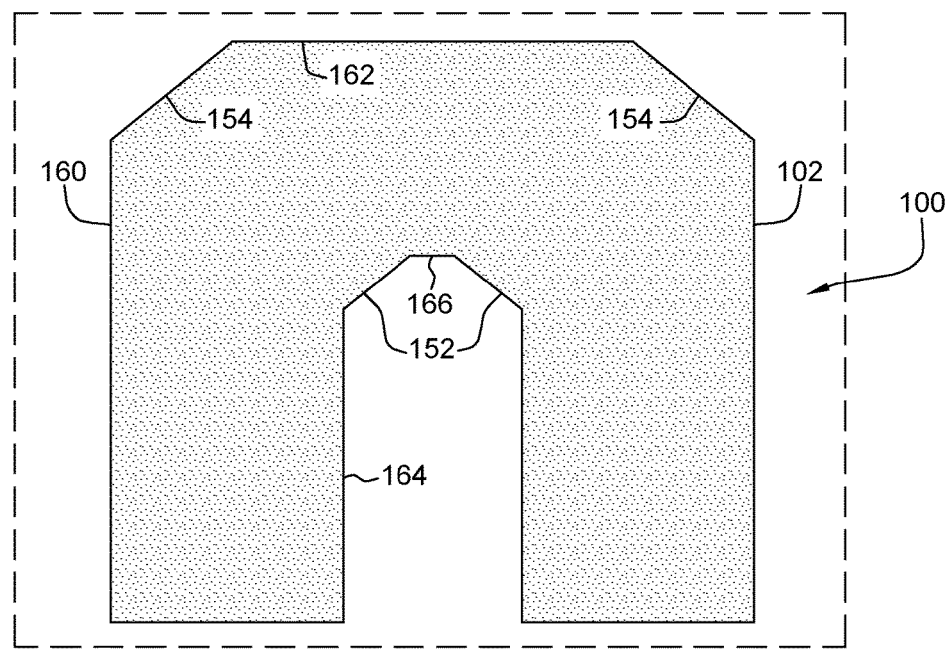
Figure 2F:
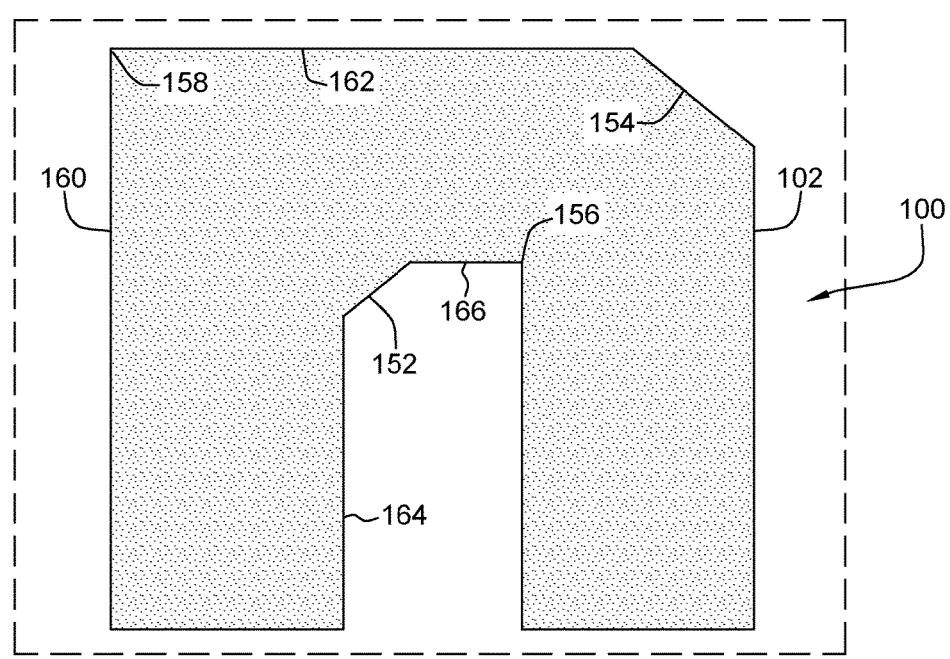

As shown in FIGS. 2A-2B, the conductor corners 156, 158 can have chamfer sides 152, 154 at locations where both the inside corners 156 and the outside corners 158 would otherwise be; only at an inside corner 156, as shown in FIG. 2C; or only at an outside corner 158, as shown in FIG. 2D. Also, FIG. 2E illustrates that all corners of the patterned conductor 102 can include chamfer sides 152, 154; and FIG. 2F illustrates that some corners of the patterned conductor 102 can include chamfer sides 152, 154, while other corners 156, 158 may not. While in some situations it may be preferable to include chamfer sides at all corners, whether a corner receives a chamfer side depends upon space constraints, the likelihood of cracking and delamination, photolithographic restrictions, as well as other design constraints; and, therefore, some corners may not have chamfer sides, while others may.

Further, the chamfer side 152, 154 of each corner may not be perfectly diagonal, but instead may form unequal angles θ, θ' (thus, θ may be equal to, or not equal, to θ'). In other words, the chamfer sides 152, 154 can form an angle of other than 45° with the linear sections (160-166) that intersect to form the corresponding corner. Thus, each chamfer side 152, 154 can terminate at unequal lengths or distances D1, D2 of corresponding linear sections (160-166) from where an apex 158' of a corresponding conductor corner 156, 158 would otherwise be, as shown in FIG. 2D. Thus, length D1 may be equal to, or not equal, to length D2, depending upon whether θ=θ'. In other words, embodiments can use diagonal chamfer sides 152, 154 (where θ=θ' and D1=D2); however, having chamfer sides 152, 154 at an angle other than 45° can unexpectedly reduce stress, cracking, and delamination compared to diagonal chamfer sides.

By including a chamfer side 152, 154 that is not at a 45° angle, cracking and delamination can be further reduced because such chamfer sides do not exert equal stress (on the patterned conductor 102 or insulators 100, 104) where the corners of the patterned conductors 102 are located; and this allows the stress to be dissipated along different stress areas from where the corners of the patterned conductors 102 are located. In other words, using chamfer sides 152, 154 that are not at a 45° angle allows the different corners to exert the stress in different ways, reducing the combinations of such corner stresses, and thereby reducing cracking and delamination. These embodiments also differentiate the stress that is generated by the different corners by including the chamfers at some corners (and not at others) as shown, for example, in FIGS. 2C, 2D, and 2F. Therefore, rather that allowing all corners to exert stress in the same way, the structures herein can provide non-diagonal chamfers, and chamfers at less than all corners, to reduce stress accumulation caused by many corners.

Additionally, these structures can be used where conductive vias 170 and via bars 180 are located. Therefore, FIGS. 3A-3D illustrate the same structures shown in FIGS. 2A-2F, except with the inclusion of a conductive via 170. Similarly, FIGS. 4A-4E illustrate the same structures shown in FIGS. 2A-2F, except with the inclusion of a conductive via bar 180.

Note that, with respect to FIG. 3A, chamfering distance is restricted by the minimum via enclosure. Further, if X' is fixed; the angle θ is between 1° and 45° (1°≤θ≤45°); λ=ß*A (with 0%<ß<50%); and assume that Y<W. Then, the derivation of X'=0.586*Y' is as set forth below:

$$\left.\begin{array}{l}Y'^2+Y'^2=Z'^2 \rightarrow Z'=\sqrt{2}\,Y'\\X'^2+X'^2=[(Z'-Y')*2]^2\end{array}\right\} \quad 2X'^2=\left[(\sqrt{2}\,Y'-Y')*2\right]^2$$

$$\downarrow$$

$$\sqrt{2}\,X'=(\sqrt{2}\,Y'-Y')*2$$

$$\downarrow$$

$$X'=(2-\sqrt{2}\,)Y'=(2-1.414)Y'=0.586Y'$$

Figure 3B:
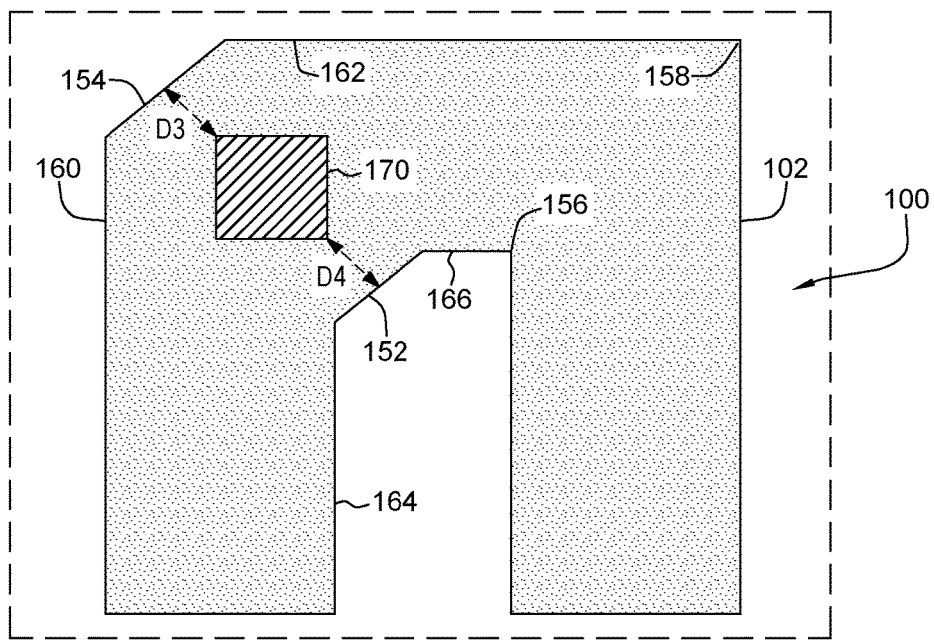

In addition, as shown in FIG. 3B, the via 170 can be located mid-way between the chamfer sides. In this example, the distance D3 can equal distance D4 (however, such is not mandatory) which can help dissipate stress by centering the conductive via 170 within the conductive patterned conductor 102 and allowing the conductive patterned conductor 102 to absorb or buffer the stress before the stress reaches the insulators 100, 104. Additionally, centering the conductive via 170 within the conductive patterned conductor 102 (D3=D4) reduces the chances of a short circuit, and compensates for improper alignment of the different layers in the laminated integrated circuit structure that may occur during manufacturing.

Figure 3C:
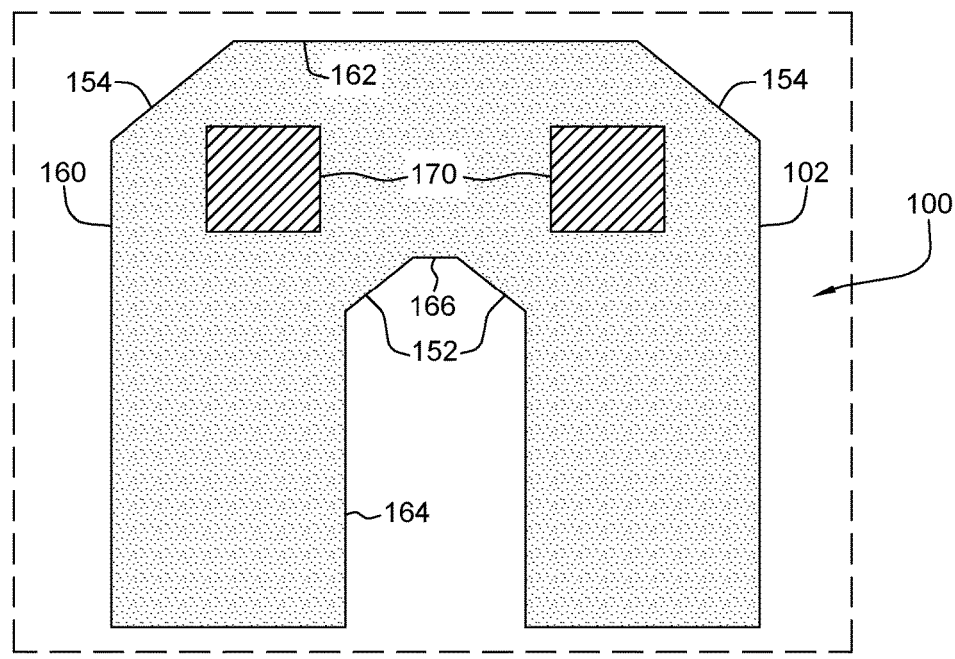
Figure 3D:
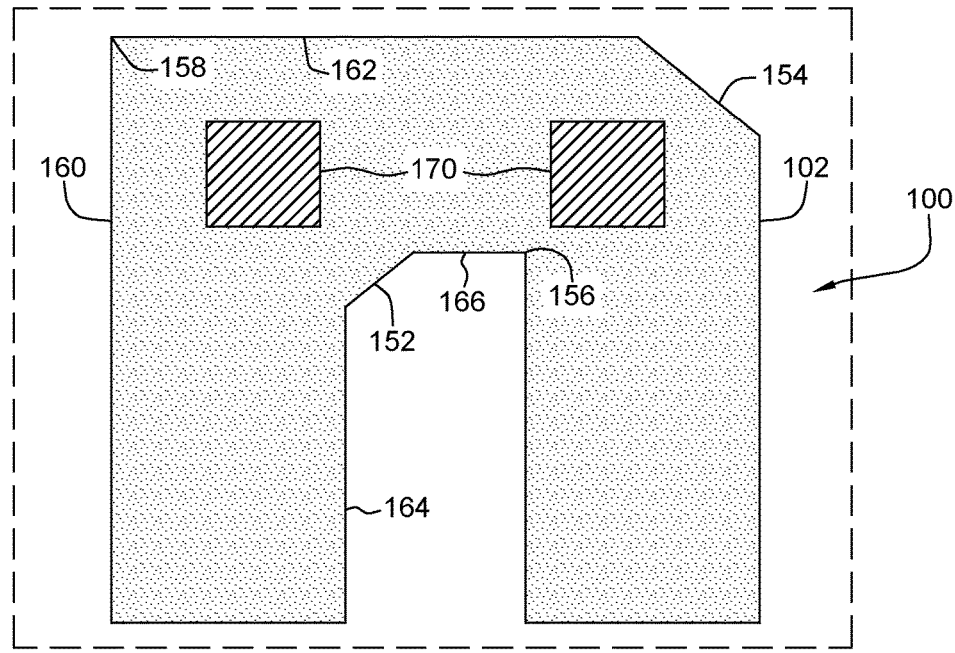

FIG. 3C shows that multiple vias 170 may be connected to the patterned conductor 102 and, in such a situation, all corners that are located where the vias 170 are located are chamfer side corners 152, 154. Alternatively, as shown in FIG. 3D, with other structures herein, some corners that are located where the vias 170 are located are chamfer side corners 152, 154, while other corners that are located where the vias 170 are located are sharp angle (e.g., right-angle) corners 156, 158.

Further, with respect to FIG. 4A, if X' is fixed; the angle θ is between 1° and 45° (1°≤θ≤45°); λ=ß*A (with 0%<ß<50%); °); λ'=ß'*A' (with 0%<ß'<100%); and assume that Y<W. Then, the derivation of X=0.586*Y and X'=0.586*Y' is as set forth below:

$$\left.\begin{array}{l}Y'^2+Y'^2=Z'^2 \rightarrow Z'=\sqrt{2}\,Y'\\X'^2+X'^2=[(Z'-Y')*2]^2\end{array}\right\} \quad 2X'^2=\left[(\sqrt{2}\,Y'-Y')*2\right]^2$$

$$\downarrow$$

$$\sqrt{2}\,X'=(\sqrt{2}\,Y'-Y')*2$$

$$X' = (2 - \sqrt{2})Y' = (2 - 1.414)Y' = 0.586Y'$$

Thus, as can be seen in FIGS. 4A-4E, the through conductor 180 can be a bar via having a similar pattern to the pattern of connected linear sections of the patterned conductor 102, but with a reduced size relative to the patterned conductor's pattern. In other words, the via bar 108 has the same number of connected linear sections (three in this example) that are parallel to, thinner than, and shorter than, the connected linear sections of the patterned conductor 102 that they contact. By having a reduced width and length relative to the connected linear sections of the patterned conductor 102, the linear sections of the via bar 108 fit within the footprint of the patterned conductor 102, without intersecting any of the sides of the linear sections of the patterned conductor 102.

Figure 4B:
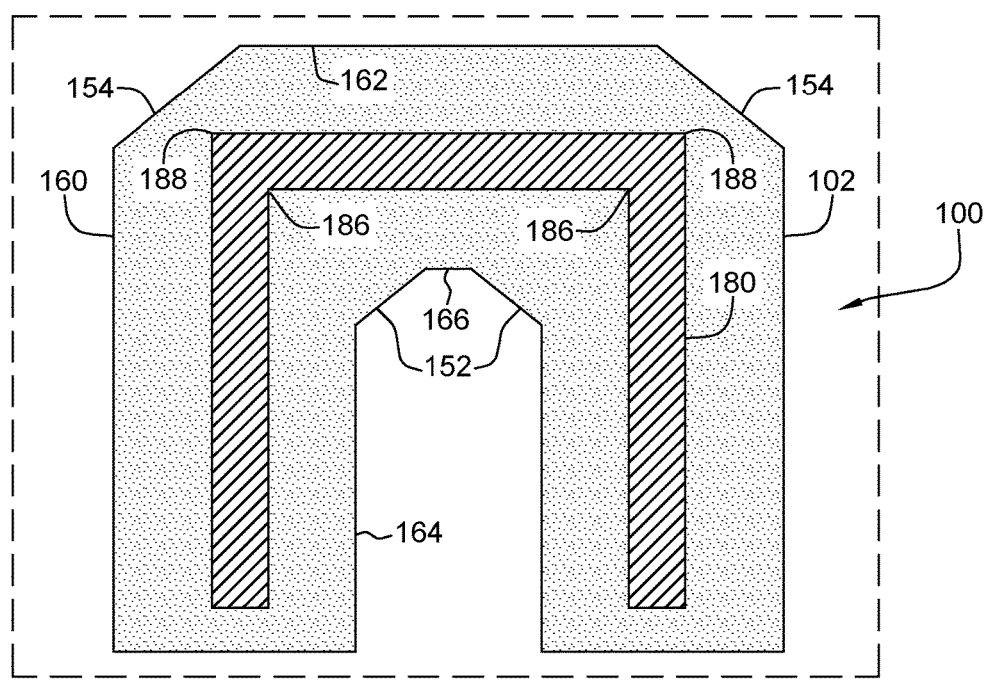
Figure 4C:
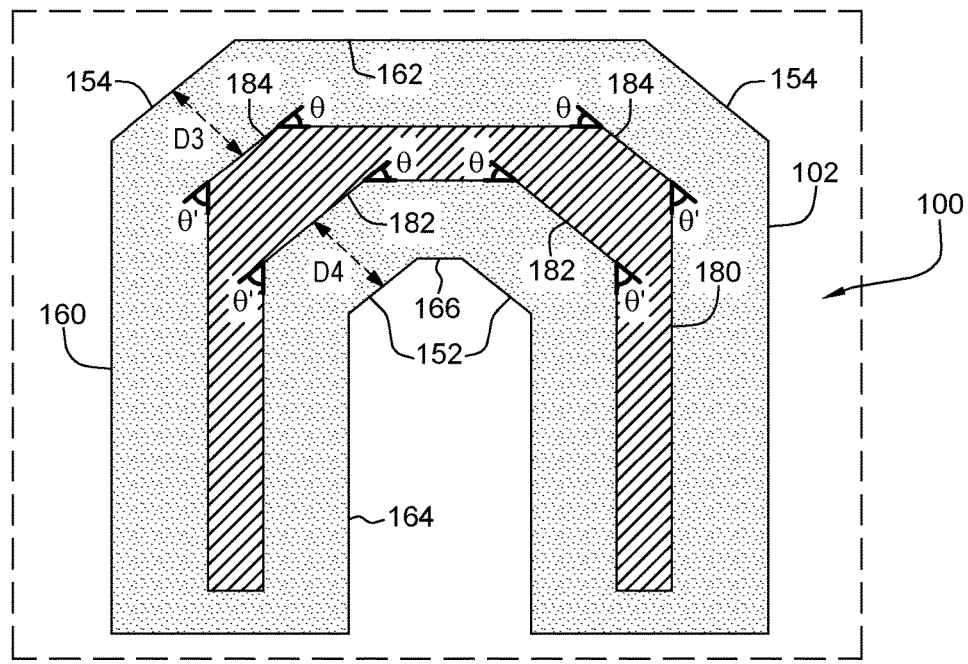

While FIGS. 4A-4B illustrates that sharp angle corners 186, 188 may be included at every bend of the via bar 180, FIG. 4C illustrates a structure where the via bar 180 includes chamfer sides 182, 184 at all locations where the patterned conductor 102 includes chamfer sides 152, 154. The chamfer sides 182, 184 of the via bar 180 can be parallel to the closest chamfer sides 152, 154 of the patterned conductor 102, or can be at different angles from those of the patterned conductor 102. Therefore, as described above, the chamfer sides 182, 184 may be perfectly perpendicular (where $\theta=\theta'=45°$, and D1=D2) or they can be non-diagonal (where $\theta\neq\theta'$, and D1$\neq$D2). In a similar way to that described above, including chamfer sides 182, 184 (that also may not be perfectly diagonal) in the via bar 180 pattern helps reduce the stress the conductors 102, 180 impart to the surrounding insulator 100, 104. Again, these shapes unpredictably help reduce stress, reduce cracking, and reduce delamination.

Figure 4D:
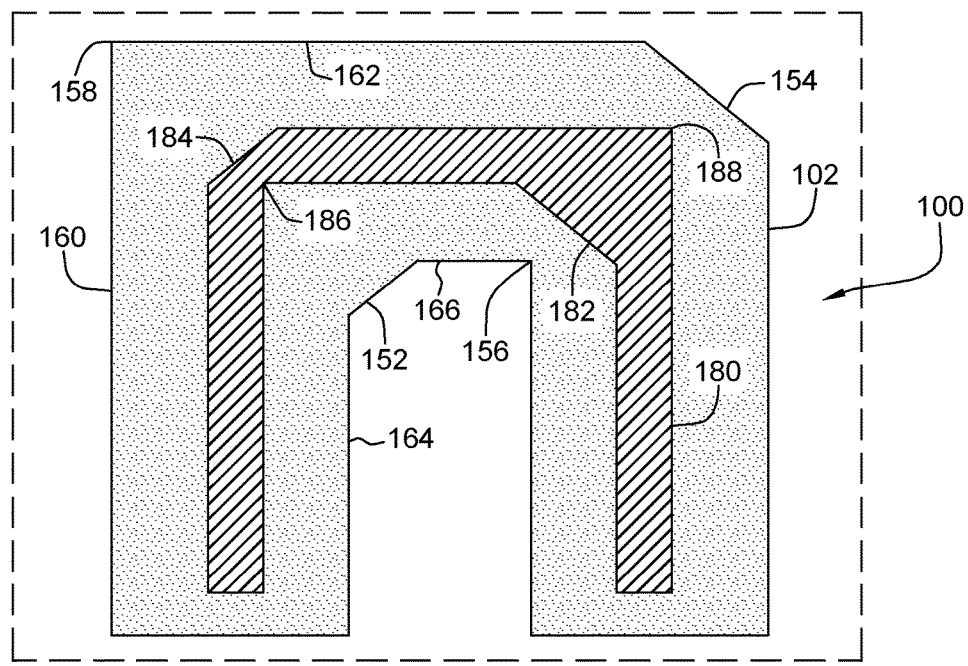
Figure 4E:
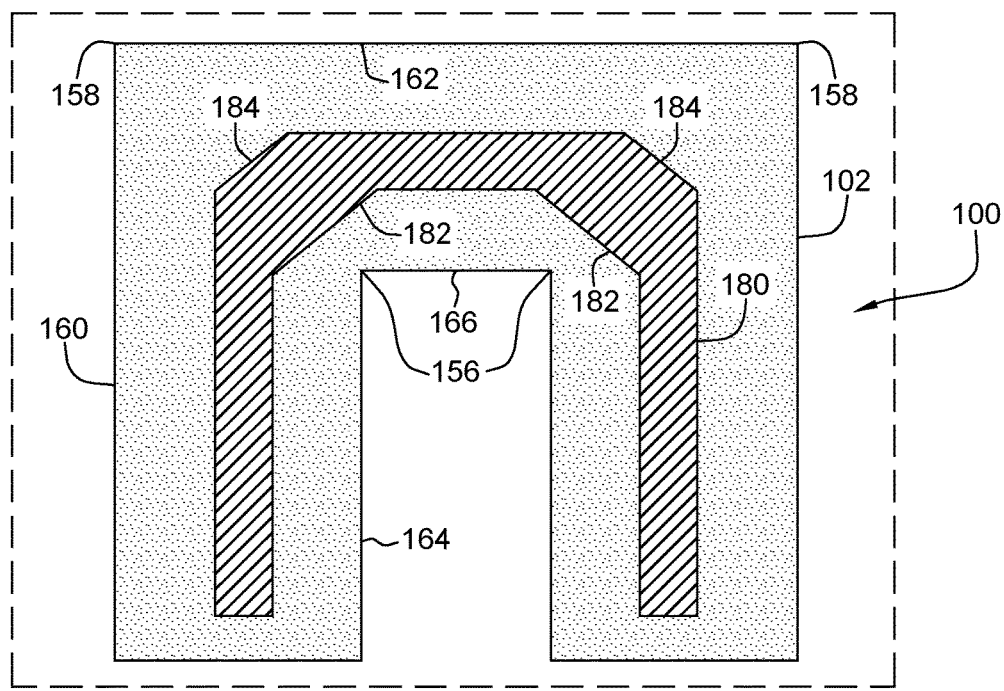

FIG. 4D illustrates examples that show that with some patterns herein, the via bar 180 can include chamfer sides 182, 184 only at inside corners, or only at outside corners, and potentially at some locations where the patterned conductor 102 does not include chamfer sides 152, 154; and other locations of the patterned conductor 102 and via bar 180 have sharp angle corners 156, 158, 186, 188. Additionally, because the chamfer sides 182, 184 of the via bar 180 reduce stress in their own, they can be used without any chamfer sides in the patterned conductor 102, as shown in FIG. 4E.

Again, whether and where to include chamfer sides in the patterned conductor 102 and via bar 180 (and whether to make such chamfer sides not be at a 45° angle) depends upon many constraints that the design may present. However, each helps reduce stress, and combined, such features increase the stress relief provided. Therefore, as restraints on designs and manufacturing allow, these features can be used in greater quantity and magnitude to provide the most stress relief possible for a given design.

Figure 5:
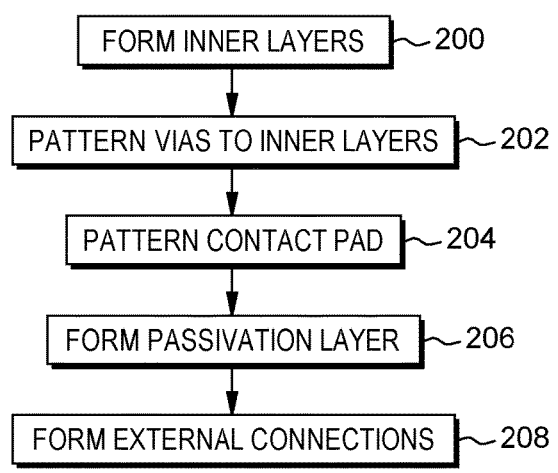
FIG. 5 is a flowchart showing processing performed by embodiments herein.

FIG. 5 is a flowchart illustrating some processing steps herein. More specifically, in item 200 methods herein form (or supply) electronic devices in at least one inner layer. In item 200, the inner layer is formed to have an upper, or topmost, first surface where the later-formed insulator layer will contact the inner layer (as shown in FIG. 1, discussed above).

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient, or steam, and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as aluminum, copper, tungsten, hafnium, tantalum, molybdenum, titanium, or nickel, or a metal silicide, any alloys of such metals, and may be deposited using physical vapor deposition, chemical vapor deposition, or any other technique known in the art.

In item 202, these methods form through conductors (conductive vias) to extend from the first surface into the inner layer, so that they are positioned to electrically connect the patterned conductors (discussed below) to the electronic devices formed or provided in item 200. As noted above, the through conductors can be vias or bar vias; and may or may not include chamfer sides.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Also, in item 204 these methods pattern the patterned conductors on the surface of the underlying insulator layer, where each of the patterned conductors is patterned to include a pattern of connected linear sections parallel to the first surface of the underlying insulator layer. In item 204, the linear sections are patterned to meet at conductor corners. More specifically, the conductor corners are patterned to include inside corners and outside corners opposite the inside corners. Thus, an angle of an arc that crosses the insulator layer between sides of the linear sections forming the inside corners (e.g., less than 180°) is less than an angle of an arc that crosses the insulator layer between sides of the linear sections forming the outside corners (e.g., greater than 180°).

During this patterning in item 204, at least one of the conductor corners of each of the patterned conductors is patterned to include a chamfer side that terminates at the linear sections. Therefore, the patterning of the chamfer side eliminates some or all right-angled corners between the linear sections. In this processing in item 204, the chamfer side can be patterned diagonally, or to form unequal angles (potentially at an angle of other than 45°) with the linear sections, along the first surface. Thus, the chamfer side is patterned to terminate at unequal lengths of corresponding linear sections from an apex of a corresponding conductor corner. Also, the conductor corners can be patterned to have the chamfer sides at both the inside corners and the outside corners, only at the inside corners, or only at the outside corners.

In item 206, the passivation layer is formed/patterned over the patterned conductor. In item 206, the patterning can leave an opening in the passivation layer to expose a portion of the patterned conductor (to expose a contact pad area of the patterned conductor) upon which a solder ball or other connection can be formed. Finally, in item 208, these structures are completed by electrically connecting the external components to the electronic devices within the inner layers, using solder balls, wire connections, etc., connected to the contact pad area.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A device comprising:
an inner layer comprising electronic devices;
an insulator layer on the inner layer, wherein the inner layer has a first surface where the insulator layer contacts the inner layer;
a patterned conductor on the first surface of the inner layer, wherein the patterned conductor comprises a pattern of connected linear sections parallel to the first surface of the inner layer, wherein the linear sections meet at conductor corners, wherein at least one of the conductor corners of the patterned conductor includes a chamfer side that terminates at the linear sections, wherein the chamfer side forms unequal angles with the linear sections, along the first surface, and wherein the chamfer side forms an angle of other than 45° with the linear sections; and
a through conductor extending into the inner layer, and being positioned to electrically connect the patterned conductor to the electronic devices.

2. The device according to claim 1, wherein the conductor corners include inside corners and outside corners opposite the inside corners, and wherein the conductor corners have the chamfer side at the inside corners and the outside corners.

3. The device according to claim 1, wherein the conductor corners include inside corners and outside corners opposite the inside corners, and wherein the patterned conductor have the chamfer side either: only at the inside corners; or only at the outside corners.

4. The device according to claim 1, wherein the chamfer side terminates at unequal lengths of corresponding linear sections from an apex of a corresponding conductor corner.

5. The device according to claim 1, wherein the chamfer side eliminates right-angled corners between the linear sections.

6. The device according to claim 1, wherein the conductor corners include inside corners and outside corners opposite the inside corners, and wherein an angle of an arc that crosses the insulator layer between sides of the linear sections forming the outside corners is between 90° and 359°.

7. A device comprising:
an inner layer comprising electronic devices;
an insulator layer on the inner layer, wherein the inner layer has a first surface where the insulator layer contacts the inner layer;
a patterned conductor on the first surface of the inner layer, wherein the patterned conductor comprises a pattern of connected linear sections parallel to the first surface of the inner layer, wherein the linear sections meet at conductor corners, wherein at least one of the conductor corners of the patterned conductor includes a chamfer side that terminates at the linear sections, and wherein the chamfer side forms unequal angles with the linear sections, along the first surface; and
a through conductor extending into the inner layer, and being positioned to electrically connect the patterned conductor to the electronic devices,
wherein the through conductor comprises a bar via having a similar, and reduced size, pattern to the pattern of connected linear sections of the patterned conductor, and
wherein the through conductor includes the chamfer side at one or more corners.

8. The device according to claim 7, wherein the chamfer side forms an angle of other than 45° with the linear sections.

9. The device according to claim 7, wherein the conductor corners include inside corners and outside corners opposite the inside corners, and wherein the conductor corners have the chamfer side at the inside corners and the outside corners.

10. The device according to claim 7, wherein the conductor corners include inside corners and outside corners opposite the inside corners, and wherein the patterned conductor have the chamfer side either: only at the inside corners; or only at the outside corners.

11. The device according to claim 7, wherein the chamfer side terminates at unequal lengths of corresponding linear sections from an apex of a corresponding conductor corner.

12. The device according to claim 7, wherein the chamfer side eliminates right-angled corners between the linear sections.

13. The device according to claim 7, wherein the conductor corners include inside corners and outside corners opposite the inside corners, and wherein an angle of an arc that crosses the insulator layer between sides of the linear sections forming the outside corners is between 90° and 359°.

14. A method comprising:
forming electronic devices in an inner layer;
forming a through conductor to extend from a first surface of the inner layer into the inner layer and be positioned to electrically connect to the electronic devices;
patterning a patterned conductor on the inner layer, wherein the patterned conductor is patterned to comprise a pattern of connected linear sections parallel to the first surface of the inner layer, wherein the linear sections are patterned to meet at conductor corners, wherein at least one of the conductor corners of the patterned conductor is patterned to include a chamfer side that terminates at the linear sections, wherein the chamfer side is patterned to form unequal angles with the linear sections, along the first surface, wherein the through conductor comprises a bar via, wherein the bar via is patterned to have a similar, and reduced size, pattern to the pattern of connected linear sections of the patterned conductor, and wherein the through conductor is patterned to include chamfer sides at locations where the patterned conductor includes chamfer sides; and
forming an insulator layer on the patterned conductor and on the first surface of the inner layer.

15. The method according to claim 14, wherein the conductor corners are patterned to include inside corners and outside corners opposite the inside corners, and wherein the conductor corners are patterned to have the chamfer side at the inside corners and the outside corners.

16. The method according to claim 14, wherein the conductor corners are patterned to include inside corners and outside corners opposite the inside corners, and wherein the patterned conductor are patterned to have the chamfer side either: only at the inside corners; or only at the outside corners.

17. The method according to claim 14, wherein the chamfer side is patterned to terminate at unequal lengths of corresponding linear sections from an apex of a corresponding conductor corner.

18. The method according to claim 14, wherein patterning of the chamfer side eliminates right-angled corners between the linear sections.

\* \* \* \* \*